United States Patent
Buller et al.

(10) Patent No.: US 6,541,321 B1
(45) Date of Patent: Apr. 1, 2003

(54) METHOD OF MAKING TRANSISTORS WITH GATE INSULATION LAYERS OF DIFFERING THICKNESS

(75) Inventors: James F. Buller, Austin, TX (US); Jon D. Cheek, Round Rock, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/145,519

(22) Filed: May 14, 2002

(51) Int. Cl.[7] .................. H01L 21/336; H01L 21/8234
(52) U.S. Cl. ..................................... 438/197; 438/287
(58) Field of Search .................. 438/197, 204, 438/205, 207, 218, 234, 283, 287, 316

(56) References Cited

U.S. PATENT DOCUMENTS 5,918,116 A  *  6/1999  Chittipeddi

OTHER PUBLICATIONS

Goto et al., "A Triple Gate Oxide CMOS Technology Using Flourine Implant for System–on–a–Chip," *2000 Symposium on VLSI Digest of Technical Papers*, pp. 148–149.

* cited by examiner

*Primary Examiner*—David Nelms
*Assistant Examiner*—Phuc T. Dang
(74) *Attorney, Agent, or Firm*—Williams, Morgan & Amerson, P.C.

(57) ABSTRACT

In one illustrative embodiment, the method comprises forming a sacrificial layer of material above a substrate comprised of silicon, performing a wet etching process to remove the sacrificial layer, implanting fluorine atoms into selected portions of the substrate after the sacrificial layer is removed, and performing a thermal oxidation process to form a plurality of gate insulation layers above the substrate, the gate insulation layers formed above the fluorine implanted selected portions of the substrate having a thickness that is greater than a thickness of the gate insulation layers formed above portions of the substrate not implanted with fluorine.

20 Claims, 4 Drawing Sheets

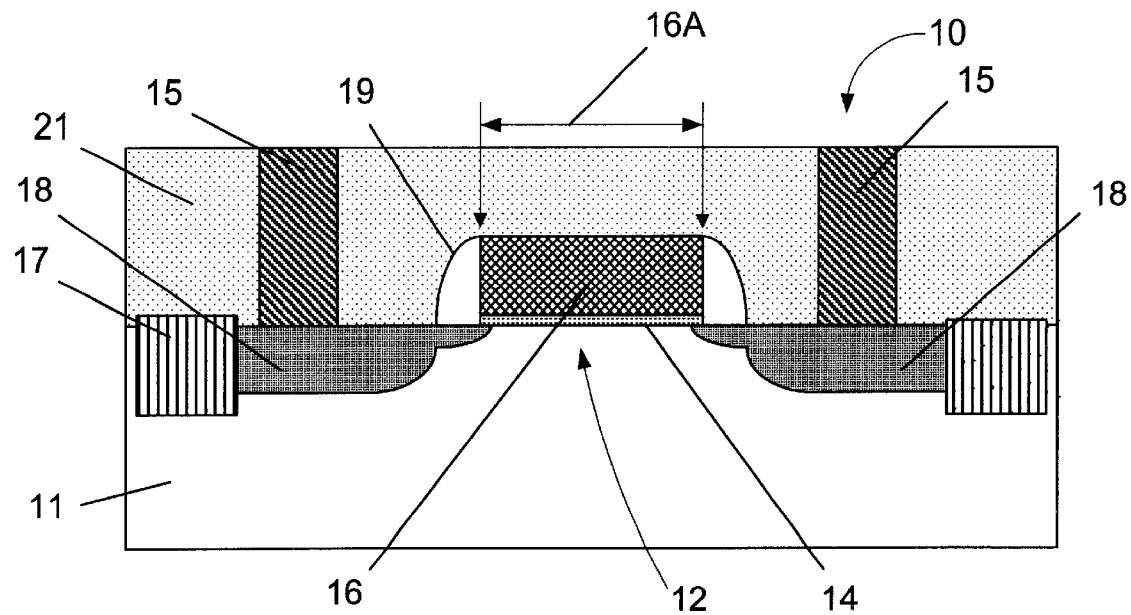
(Prior Art) Figure 1
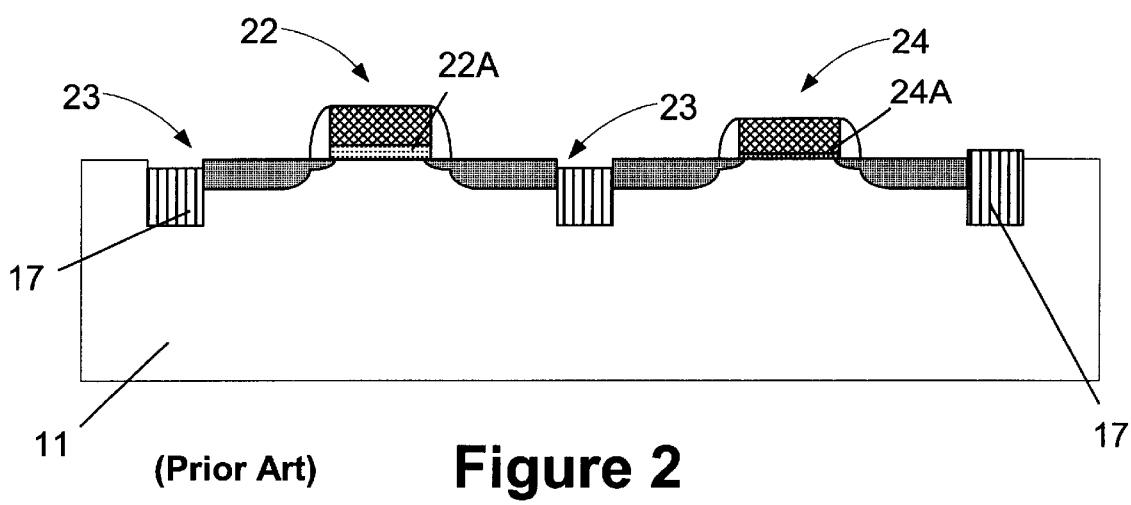
(Prior Art) Figure 2

METHOD OF MAKING TRANSISTORS WITH GATE INSULATION LAYERS OF DIFFERING THICKNESS

BACKGROUND OF THE INVENTION

1. Field of the Invention

This invention relates generally to semiconductor fabrication technology, and, more particularly, to a method of making transistors with gate insulation layers of differing thickness.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, FIG. 1 depicts an example of an illustrative transistor 10 fabricated on a wafer or substrate 11. The transistor 10 is comprised of a gate insulation layer 14, a gate electrode 16, sidewall spacers 19 and source/drain regions 18. The gate electrode 16 has a critical dimension (gate length) 16A. Trench isolation regions 17 are also formed in the substrate 11. Also depicted in FIG. 1 are a plurality of conductive contacts 15 formed in a layer of insulating material 21. The conductive contacts 15 provide electrical connection to the source/drain regions 18. As constructed, the transistor 10 defines a channel region 12 in the substrate 11 beneath the gate insulation layer 14. The substrate 11 is normally doped with an appropriate dopant material, e.g., a P-type dopant such as boron or boron difluoride for NMOS devices, or an N-type dopant such as arsenic or phosphorous for PMOS devices.

In an effort to increase the performance characteristics of modern integrated circuit devices, the gate insulation layer 14, which is typically comprised of silicon dioxide, may be formed as thin as 2.0–2.5 nm (20–25 Å), and further reductions are planned in the future. The thin gate insulation layer 14 enables higher transistor drive currents and faster transistor switching speeds. However, reducing the thickness of the gate insulation layer 14 to the levels described above may also lead to other problems. For example, at the operating voltages of some modern integrated circuit devices, a gate current, i.e., a current between the substrate 11 and the gate electrode 16, may be established. Such a gate current is due, in part, to the reduced thickness of the gate insulation layer 14, which tends to limit its ability to perform its intended function of electrically isolating the gate electrode 16. This gate current can be problematic in many respects in that it may increase power consumption and off-state leakage currents for the transistor 10.

However, in many modern integrated circuit devices, e.g., microprocessors, application-specific integrated circuits (ASICs), etc., there may be situations where the formation of such a very thin gate insulation layer 14 is not required for all circuits in the integrated circuit product. For example, with respect to a microprocessor, there may be some circuits on the microprocessor that are not part of the "critical path" as it relates to establishing the switching speed of the completed device. In other cases, there may be some circuits on the microprocessor where it may be desirable to have an increased gate insulation thickness for other reasons. For example, for a variety of input/output circuits that interface with external devices, it may be desirable to have a thicker gate insulation layer 14 to ensure that the gate current does not get excessively high. As another example, there may be some circuits that occupy a great deal of plot space on the integrated circuit device but, nevertheless, are not part of the critical path as it relates to establishing the operating frequency of the integrated circuit device. For example, in the case of a microprocessor, there may be many decoupling capacitor circuits that, while they occupy a great deal of plot space on the integrated circuit device, they are not part of the critical path for the microprocessor in terms of performance. In such a situation, if the decoupling capacitors were made with a very thin gate insulation layer, then the decoupling capacitor circuits would unnecessarily increase the gate current for the overall device and lead to some of the disadvantages outlined above.

Thus, in some modern integrated circuit devices, manufacturers have begun forming transistors with different gate insulation thicknesses for various circuits within the integrated circuit device, i.e., so-called dual gate oxide circuits, triple gate oxide circuits. That is, for at least some circuits, the gate insulation layer 14 for certain transistors 10 is formed to a very thin thickness, whereas other transistors in less critical circuits of the integrated circuit device have a thicker gate insulation layer 14. For example, with reference to FIG. 2, a first transistor 22 has a relatively thick gate insulation layer 22A, whereas a second transistor 24 has a relatively thin gate insulation layer 24A. The relative thicknesses of the gate insulation layers 22A, 24A depicted in FIG. 2 are exaggerated for purposes of clarity and explanation. As described above, the transistor 24 may form part of a critical path of the integrated circuit device in terms of performance, whereas the transistor 22 may not be in such a critical path, or it may otherwise be important to provide a relatively thick gate insulation layer 22A for the transistor 22, i.e., it may be part of the input/output circuitry for the integrated circuit product.

One illustrative process flow for forming the transistors 22, 24 depicted in FIG. 2 is as follows. Initially, the trench isolation regions 17 are formed in the substrate 11. Thereafter, a sacrificial oxide layer (not shown) may be deposited or thermally grown above the surface of the substrate 11. Next, a patterned layer of photoresist (not shown) is formed above the substrate 11. The patterned layer of photoresist is used to expose selected portions of the substrate 11 where it is desired to form transistors having an increased gate insulation thickness, such as the transistor 22 depicted in FIG. 2. After the masking layer is formed, an ion implant process is performed to implant fluorine atoms through the sacrificial oxide layer into the portions of the substrate 11 exposed by the patterned masking layer. Thereafter, the patterned photoresist masking layer is removed. Then, a wet etching process, typically a wet etching process using HF acid, is used to remove the sacrificial oxide layer and to generally clean the substrate 11 prior to the formation of the gate insulation layers 22A, 24A for the transistor devices 22, 24. Then, a thermal oxidation process is performed to form the gate insulation layers 22A, 24A depicted in FIG. 2. The gate insulation layers formed in areas where fluorine is implanted into the substrate 11 are thicker because the implanted fluorine atoms enhance the oxidation rate of the silicon substrate 11. After the gate insulation layers 22A, 24A are formed, traditional processing operations may be continued to form the transistors 22, 24.

Unfortunately, the aforementioned process flow is not without problems. For example, during the etching process, i.e., the HF acid etching process mentioned above that is performed to remove the sacrificial oxide layer, the trench isolation regions 17 that were previously exposed to the fluorine implant process (that was performed through the sacrificial oxide layer) tend to etch at a faster rate than that of trench isolation regions 17 not exposed to the fluorine implant process. As a result, as depicted in FIG. 2, the isolation regions 17 implanted with fluorine, i.e., the insulation regions associated with the transistor 22, tend to be over-etched during the wet etching process used to remove the sacrificial oxide layer. As a result, portions 23 of the substrate 11 adjacent the affected isolation regions 17 may be exposed. The exposed portions of the substrate 11 may be problematic in many respects, e.g., it may lead to reduced device performance.

The present invention is directed to a method that may solve, or at least reduce, some or all of the aforementioned problems.

SUMMARY OF THE INVENTION

The present invention is generally directed to a method of making transistors with differing gate insulation thickness. In one illustrative embodiment, the method comprises forming a sacrificial layer of material above a substrate comprised of silicon, performing a wet etching process to remove the sacrificial layer, implanting fluorine atoms into selected portions of the substrate after the sacrificial layer is removed, and performing a thermal oxidation process to form a plurality of gate insulation layers above the substrate, the gate insulation layers formed above the fluorine implanted selected portions of the substrate having a thickness that is greater than a thickness of the gate insulation layers formed above portions of the substrate not implanted with fluorine.

BRIEF DESCRIPTION OF THE DRAWINGS

The invention may be understood by reference to the following description taken in conjunction with the accompanying drawings, in which like reference numerals identify like elements, and in which:

FIG. 1 is a cross-sectional view of an illustrative prior art semiconductor device formed above a substrate;

FIG. 2 is a cross-sectional view of an illustrative substrate having a plurality of transistors with gate insulation layers of differing thickness formed in accordance with one illustrative prior art technique;

Figure 3A:
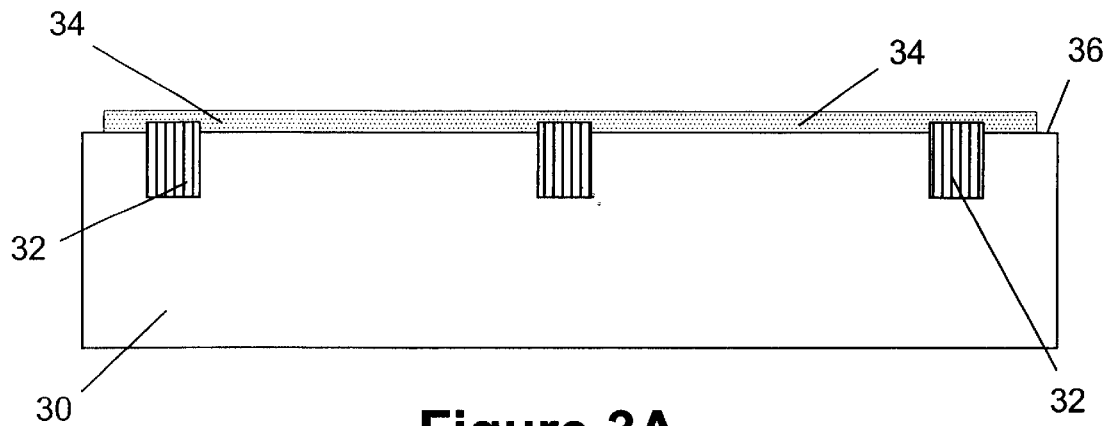
FIGS. 3A–3F are various cross-sectional views of a method in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to a method of making transistors with gate insulation layers of differing thickness. Although the present invention will be initially disclosed in the context of the formation of an illustrative NMOS transistor, those skilled in the art will understand after a complete reading of the present application that the present invention is not so limited. More particularly, the present invention may be employed with respect to a variety of technologies, e.g., NMOS, PMOS, CMOS, etc., and it may be employed with a variety of different type devices, e.g., memory devices, microprocessors, logic devices, etc. The present invention may also be employed in the context of forming integrated circuit devices above silicon-on-insulator (SOI) substrates and the like.

As shown in FIG. 3A, a plurality of isolation regions 32 are formed in a semiconducting substrate 30, and a sacrificial layer 34 is formed above the surface 36 of the substrate 30. Prior to the steps depicted in FIG. 3A, various well implants and anneal processes may be performed to form the desired wells (if any) within the substrate 30 for forming NMOS and PMOS devices, i.e., a CMOS application. The isolation regions 32 may be formed by a variety of known techniques. For example, a plurality of trenches may be formed in the substrate 30 and subsequently filled with an insulating material, such as silicon dioxide. In a similar sense, the sacrificial layer 34 may be comprised of, for example, silicon dioxide, it may have a thickness of approximately 10–20 nm (100–200Å), and it may be formed by a plurality of techniques, i.e., deposition, thermal growth, etc.

Figure 3B:
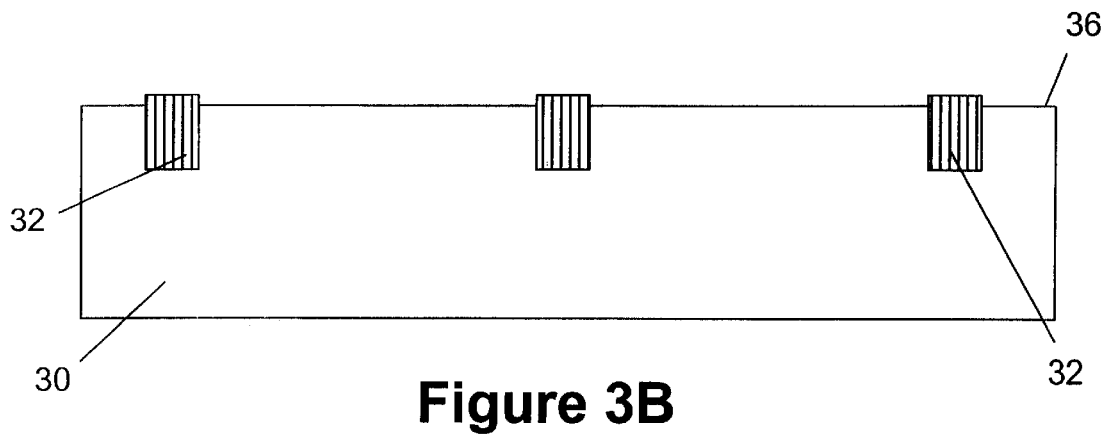

Next, as indicated in FIG. 3B, a wet etching process is performed to remove the sacrificial layer 34 and clean the surface 36 of the substrate 30 prior to the formation of the gate insulation layers for the completed device. This wet etching process may be performed using, for example, a dilute HF acid at a concentration of approximately 10:1.

Figure 3C:
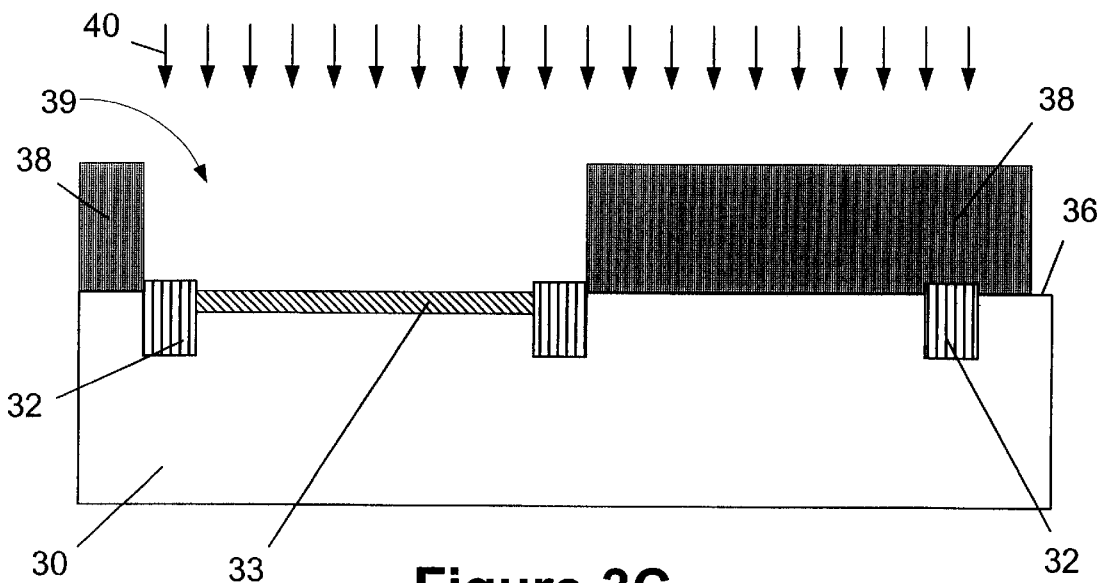

Thereafter, as shown in FIG. 3C, a patterned layer of photoresist 38 (positive or negative material) is formed above the surface 36 of the substrate 30. The patterned layer of photoresist 38 has a plurality of openings 39 through which areas of the substrate 30 are exposed for further processing. An ion implantation process, as indicated by arrows 40, is then performed to implant fluorine atoms into the portions of the substrate 30 exposed by the patterned masking layer 38. The implant dose of the fluorine atoms will vary depending upon the desired thickness of the gate insulation layers to be formed above the substrate 30 in the regions where the fluorine atoms are implanted. In general, the ion implant process 40 may be performed using an implant dose of approximately $5E^{14}$–$5E^{15}$ ions/cm$^2$. This ion implant process results in the implantation of fluorine atoms into the substrate 30, as indicated by a region 33. Note that this ion implant process 40 is performed after the sacrificial layer 34 has been removed by performing a wet etching or stripping process, e.g., a dilute HF acid etch process.

Figure 3D:
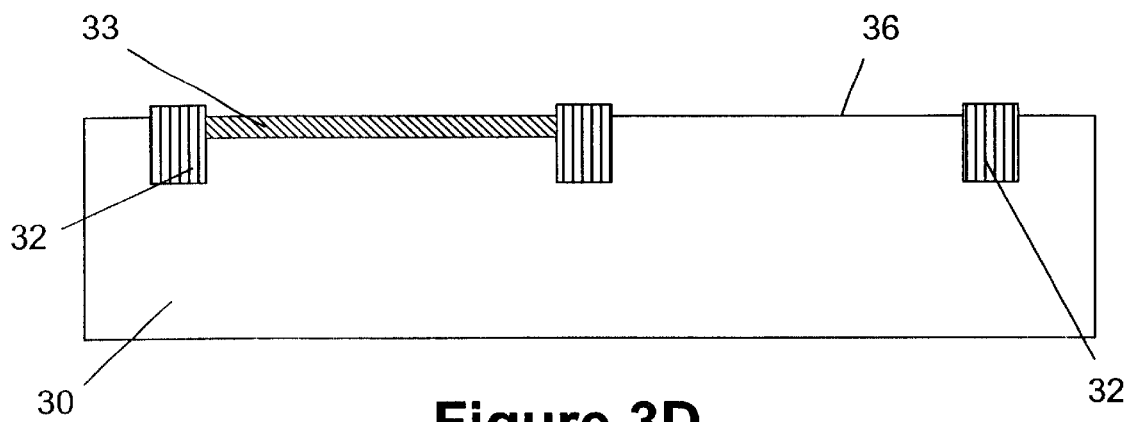

Next, as indicated in FIG. 3D, the patterned layer of photoresist 38 is removed and the surface 36 of the substrate 30 is cleaned. The removal of the photoresist material may be accomplished by a variety of techniques, e.g., by performing an oxygen ($O_2$) plasma ashing process, followed by a dilute sulfuric acid wet rinse process. Note that, in the inventive process flow described herein, the sacrificial layer 34 is removed prior to the fluorine implant step 40 wherein fluorine atoms are implanted into the exposed portions of the substrate 30 and the exposed isolation structures 32. This is in contrast to the prior art process flow wherein the sacrificial layer 34 was removed after the isolation regions had been exposed to the fluorine implant process, a process that resulted in the affected isolation regions (those implanted with fluorine) exhibiting an enhanced etch rate. As a result of this new process flow, the integrity of the isolation regions 32 may be better maintained, and the undesirable exposure of portions of the substrate 30 adjacent the isolation regions 32 may be avoided. That is, the present invention may be used to reduce or eliminate the exposed portions 23 of the substrate, as depicted in FIG. 2.

Figure 3E:
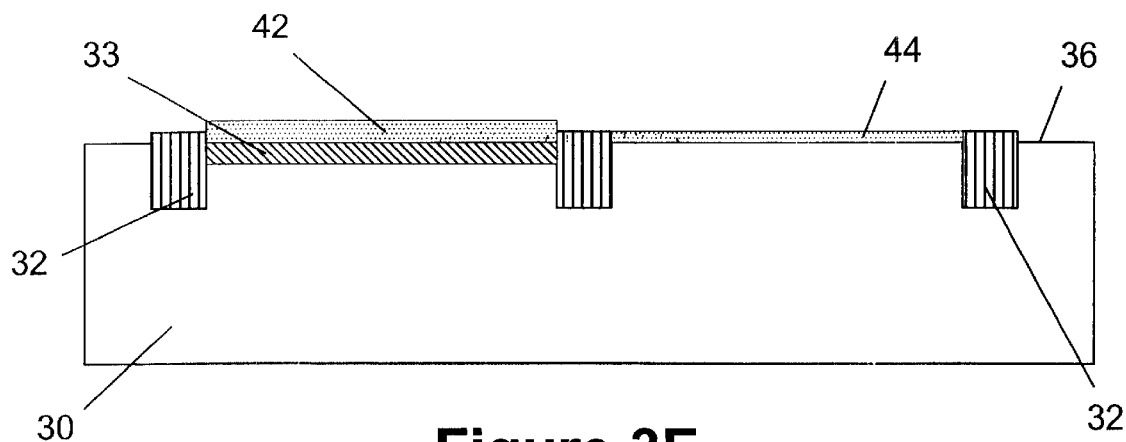

Then, as indicated in FIG. 3E, a thermal oxidation process is performed at a temperature of approximately 600–1000° C. to form gate insulation layers 42, 44 depicted in FIG. 3E. The gate insulation layer 42 has a thickness that is approximately 0.1–1.0 nm (1–10 Å) thicker than the gate insulation layer 44. The increased thickness of the gate insulation layer 42 is due to the presence of the fluorine atoms implanted during the implant process 40 described above. The difference in the thickness of the insulation layers 42, 44 may be controlled based upon the amount of fluorine implanted into the substrate 30. In general, the more fluorine implanted into the substrate 30 during the implant process 40, the greater than the thickness differential between the gate insulation layer 42 and the gate insulation layer 44. In one illustrative embodiment, the gate insulation layer 42 may have a thickness of approximately 2.1–3.0 nm (21–30 Å), whereas the gate insulation layer 44 may have a thickness of approximately 2.0–2.5 nm (20–25 Å).

Figure 3F:
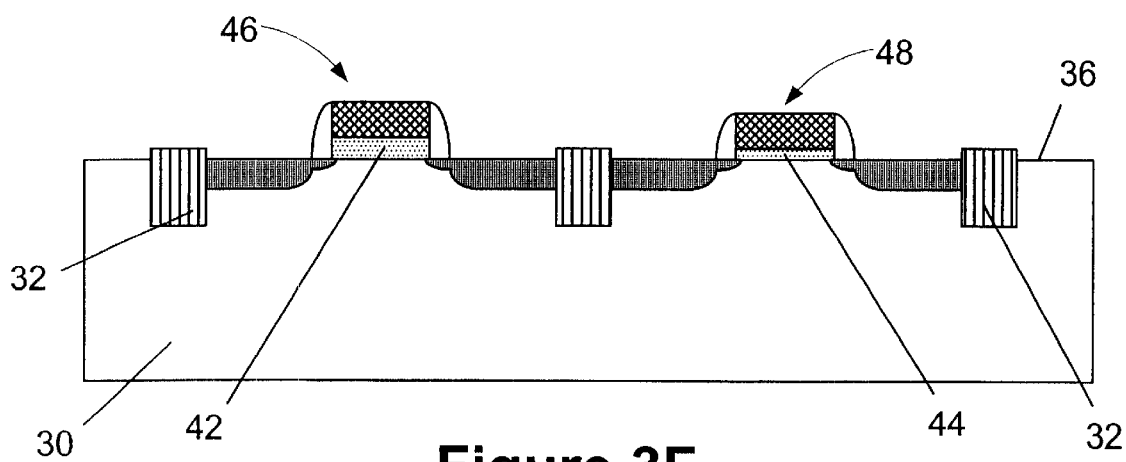

Next, additional processing is performed to complete the formation of the transistors 46 and 48 as indicated in FIG. 3F. Such processing includes formation of the gate electrode, sidewall spacers and source/drain regions. Note that, using the inventive process flow described herein, the integrity of the isolation regions adjacent the area of the substrate 30 implanted with fluorine atoms is maintained. That is, due to the fact that the sacrificial layer 34 is removed prior to the fluorine implant process 40, the etching rate of the isolation regions is not enhanced by implanting fluorine into the isolation regions prior to the isolation regions being exposed to the relatively aggressive wet etch process, e.g., HF acid etching process, that is used to remove the sacrificial layer 34. As a result, the integrity of the isolation regions remains intact.

Figure 4A:
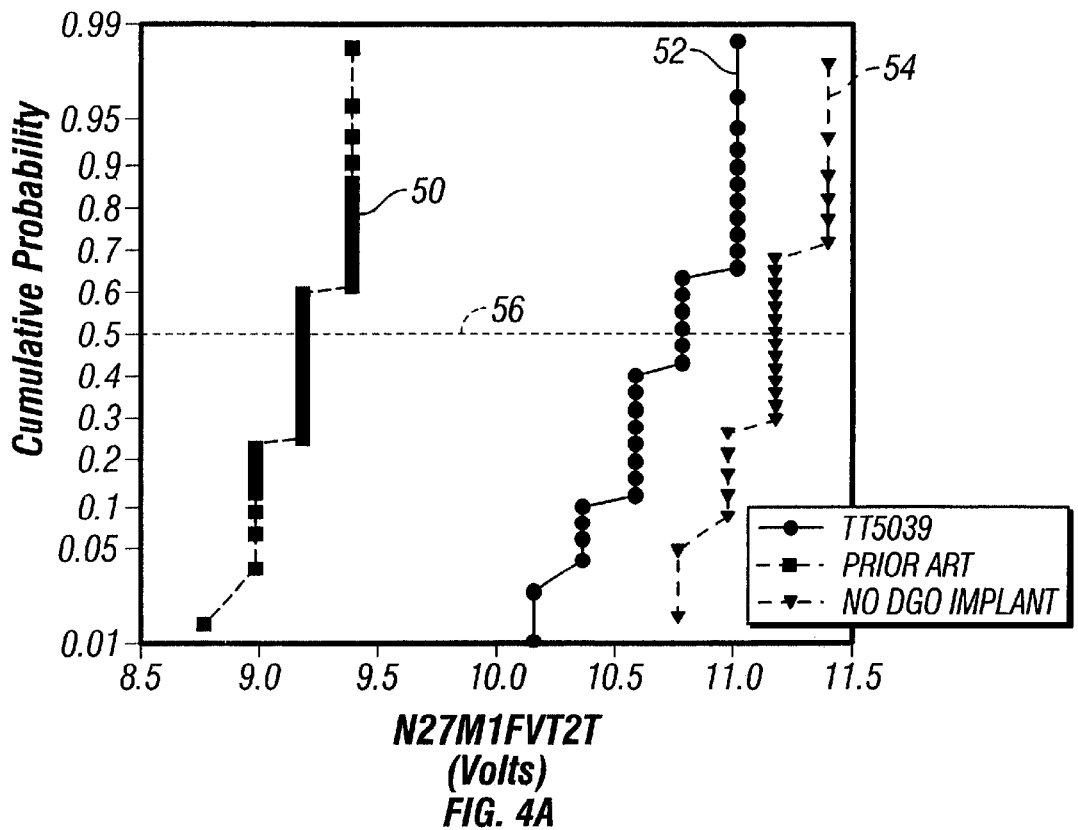
FIGS. 4A–4B are plots of various test data indicating the effectiveness of the present invention.
Figure 4B:
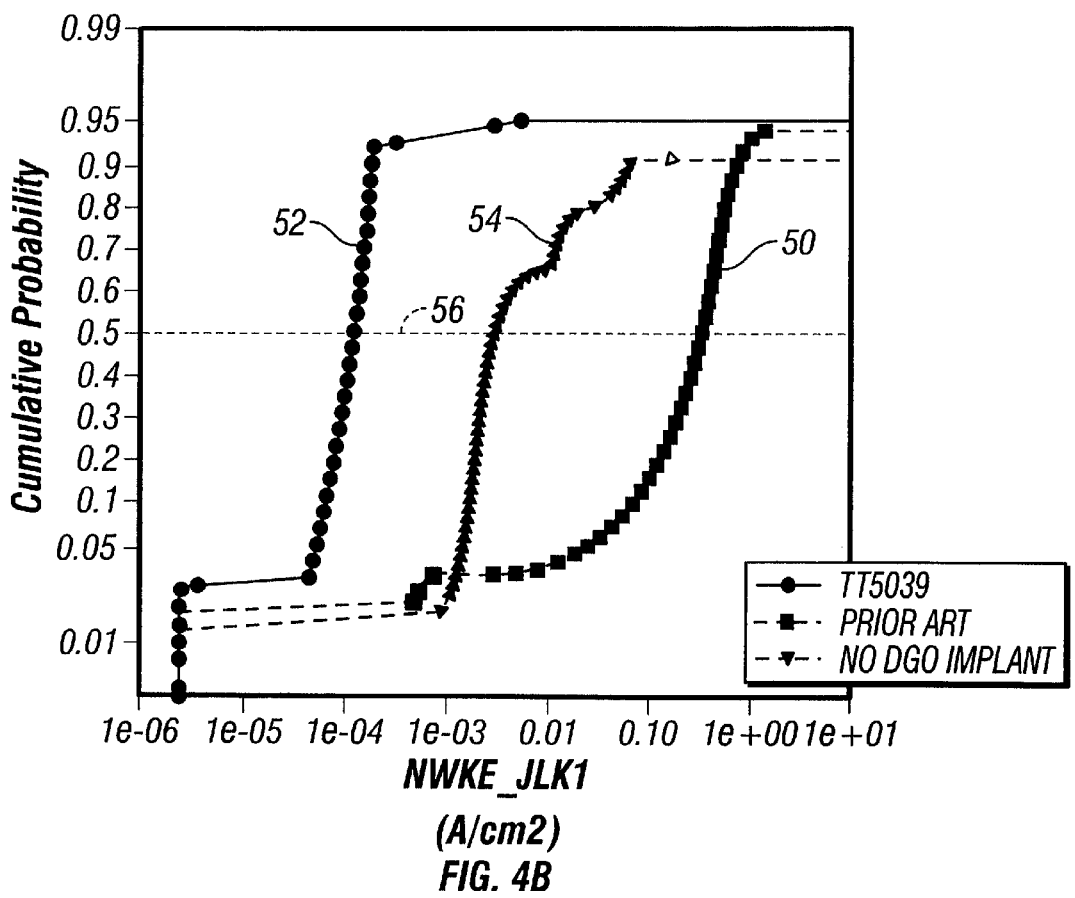

FIGS. 4A and 4B are plots of various test data demonstrating the effectiveness of the present invention. FIG. 4A is a plot of the parasitic field transistor threshold voltage. FIG. 4B is a plot of the gate current for the active/STI edge gate oxide capacitors. In both plots, three lines are identified. Line 50 represents data for devices formed in accordance with the prior art techniques described in the background section of the application. That is, line 50 is representative of devices wherein the isolation regions are exposed to a fluorine implant process and thereafter exposed to an etching process. Line 52 corresponds to devices made in accordance with the inventive methods disclosed herein. Line 54 is representative of devices where no fluorine implant is performed at all.

With respect to FIG. 4A, the higher the threshold voltage of the parasitic field transistor, the better. As shown in FIG. 4A, at the median value 56 of the threshold voltage for the sampled universe is approximately 9.2 volts for the devices made in accordance with the prior art techniques (plot 50); approximately 10.8 volts for the devices made in accordance with the present invention (plot 52); and approximately 11.2 volts for devices wherein no dual gate oxide implantation step is performed (plot 54). The relatively higher threshold voltage exhibited by plot 52 (present invention) as compared to plot 50 (prior art) means that, through use of the present invention, there is less consumption or erosion of the isolation regions using the processes disclosed herein for dual gate formation.

Similarly, the median value 56 for the gate current of the active/STI edge intensive gate oxide capacitors is lower for devices formed in accordance with the present invention as compared to devices formed in accordance with the prior art process flow. That is, as shown in FIG. 4B, the median value 56 for the gate current of the devices formed in accordance with the present invention (plot 52) is approximately $1e^{-4}$ amps/cm$^2$, whereas the gate current for the prior art process (plot 50) is approximately 0.13 amps/cm$^2$. The gate current for nondual gate devices (plot 54) is shown to be slightly less than $1e^{-3}$ amps/cm$^2$. Thus, through use of the present invention, the undesirable gate current for the active/STI edge capacitors is lower than the gate current of devices made in accordance with the prior art process flow. This is the result of the reduced erosion of the isolation regions using the inventive process disclosed herein for forming dual gate oxides.

The present invention is generally directed to a method of making transistors with gate insulation layers of differing thickness. In one illustrative embodiment, the method comprises forming a sacrificial layer of material above a substrate comprised of silicon, performing a wet etching process to remove the sacrificial layer, implanting fluorine atoms into selected portions of the substrate after the sacrificial layer is removed, and performing a thermal oxidation process to form a plurality of gate insulation layers above the substrate, the gate insulation layers formed above the fluorine implanted selected portions of the substrate having a thickness that is greater than a thickness of the gate insulation layers formed above portions of the substrate not implanted with fluorine.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a sacrificial layer of material above a substrate comprised of silicon;
    performing a wet etching process to remove said sacrificial layer;
    implanting fluorine atoms into selected portions of said substrate after said sacrificial layer is removed; and
    performing a thermal oxidation process to form a plurality of gate insulation layers above said substrate, said gate insulation layers formed above said fluorine implanted selected portions of said substrate having a thickness that is greater than a thickness of said gate insulation layers formed above portions of said substrate not implanted with fluorine.

2. The method of claim 1, wherein forming a sacrificial layer of material above a substrate comprised of silicon comprises forming a sacrificial layer comprised of silicon dioxide above a substrate comprised of silicon.

3. The method of claim 1, wherein forming a sacrificial layer of material above a substrate comprised of silicon comprises thermally growing a sacrificial layer comprised of silicon dioxide above said substrate comprised of silicon.

4. The method of claim 1, wherein performing a wet etching process to remove said sacrificial layer comprises performing a dilute HF acid wet etching process to remove said sacrificial layer.

5. The method of claim 1, wherein implanting fluorine atoms into selected portions of said substrate after said sacrificial layer is removed comprises implanting fluorine atoms into selected portions of said substrate after said sacrificial layer is removed, said fluorine atoms being implanted at a dose of approximately $5E^{14}-5E^{15}$ ions/cm$^2$.

6. The method of claim 1, wherein implanting fluorine atoms into selected portions of said substrate after said sacrificial layer is removed comprises:
    forming a patterned layer of photoresist material above said substrate; and
    implanting fluorine atoms into said substrate after said sacrificial layer is removed using said patterned layer of photoresist material as a mask.

7. The method of claim 1, wherein performing a thermal oxidation process to form a plurality of gate insulation layers above said substrate, said gate insulation layers formed above said fluorine implanted selected portions of said substrate having a thickness that is greater than a thickness of said gate insulation layers formed above portions of said substrate not implanted with fluorine, comprises performing a thermal oxidation process to form a plurality of gate insulation layers above said substrate, said gate insulation layers formed above said fluorine implanted selected portions of said substrate having a thickness that is greater than a thickness of said gate insulation layers formed above portions of said substrate not implanted with fluorine, said thickness difference being approximately 0.1–1.0 nm.

8. The method of claim 1, further comprising forming a gate electrode structure above each of said plurality of gate insulation layers.

9. The method of claim 1, wherein performing a thermal oxidation process comprises performing a thermal oxidation process at a temperature of approximately 600–1000° C.

10. A method, comprising:
    forming a sacrificial layer of silicon dioxide above a substrate comprised of silicon;
    performing a dilute HF acid wet etching process to remove said sacrificial layer;
    implanting fluorine atoms into selected portions of said substrate after said sacrificial layer of silicon dioxide is removed; and
    performing a thermal oxidation process to form a plurality of gate insulation layers above said substrate, said gate insulation layers formed above said fluorine implanted selected portions of said substrate having a thickness that is greater than a thickness of said gate insulation layers formed above portions of said substrate not implanted with fluorine.

11. The method of claim 10, wherein forming a sacrificial layer of silicon dioxide above a substrate comprised of silicon comprises thermally growing a sacrificial layer comprised of silicon dioxide above said substrate comprised of silicon.

12. The method of claim 10, wherein implanting fluorine atoms into selected portions of said substrate after said sacrificial layer is removed comprises implanting fluorine atoms into selected portions of said substrate after said sacrificial layer is removed, said fluorine atoms being implanted at a dose of approximately $5E^{14}-5E^{15}$ ions/cm$^2$.

13. The method of claim 10, wherein implanting fluorine atoms into selected portions of said substrate after said sacrificial layer is removed comprises:
    forming a patterned layer of photoresist material above said substrate; and
    implanting fluorine atoms into said substrate after said sacrificial layer is removed using said patterned layer of photoresist material as a mask.

14. The method of claim 10, wherein performing a thermal oxidation process to form a plurality of gate insulation layers above said substrate, said gate insulation layers formed above said fluorine implanted selected portions of said substrate having a thickness that is greater than a thickness of said gate insulation layers formed above portions of said substrate not implanted with fluorine, comprises performing a thermal oxidation process to form a plurality of gate insulation layers above said substrate, said gate insulation layers formed above said fluorine implanted selected portions of said substrate having a thickness that is greater than a thickness of said gate insulation layers formed above portions of said substrate not implanted with fluorine, said thickness difference being approximately 0.1–1.0 nm.

15. The method of claim 10, further comprising forming a gate electrode structure above each of said plurality of gate insulation layers.

16. The method of claim 10, wherein performing a thermal oxidation process comprises performing a thermal oxidation process at a temperature of approximately 600–1000° C.

17. A method, comprising:

thermally growing a sacrificial layer of silicon dioxide above a substrate comprised of silicon;

performing a dilute HF acid wet etching process to remove said sacrificial layer;

forming a patterned layer of photoresist material above said substrate;

implanting fluorine atoms into said substrate after said sacrificial layer is removed using said patterned layer of photoresist material as a mask; and performing a thermal oxidation process to form a plurality of gate insulation layers above said substrate, said gate insulation layers formed above said fluorine implanted selected portions of said substrate having a thickness that is greater than a thickness of said gate insulation layers formed above portions of said substrate not implanted with fluorine, said thickness difference being approximately 0.1–1.0 nm.

18. The method of claim 17, wherein implanting fluorine atoms into selected portions of said substrate after said sacrificial layer is removed comprises implanting fluorine atoms into selected portions of said substrate after said sacrificial layer is removed, said fluorine atoms being implanted at a dose of approximately $5E^{14}$–$5E^{15}$ ions/cm$^2$.

19. The method of claim 17, further comprising forming a gate electrode structure above each of said plurality of gate insulation layers.

20. The method of claim 17, wherein performing a thermal oxidation process comprises performing a thermal oxidation process at a temperature of approximately 600–1000° C.

* * * * *